United States Patent
You

(10) Patent No.: US 10,403,387 B2
(45) Date of Patent: Sep. 3, 2019

(54) REPAIR CIRCUIT USED IN A MEMORY DEVICE FOR PERFORMING ERROR CORRECTION CODE OPERATION AND REDUNDANCY REPAIR OPERATION

(71) Applicant: SK hynix Inc., Gyeonggi-do (KR)

(72) Inventor: Jung-Taek You, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/843,733

(22) Filed: Dec. 15, 2017

(65) Prior Publication Data

US 2018/0330798 A1 Nov. 15, 2018

(30) Foreign Application Priority Data

May 12, 2017 (KR) .................... 10-2017-0059331

(51) Int. Cl.
| | | |
|---|---|---|
| *G11C 17/16* | (2006.01) | |
| *G11C 29/44* | (2006.01) | |
| *G06F 11/10* | (2006.01) | |
| *G11C 29/42* | (2006.01) | |
| *G11C 29/00* | (2006.01) | |
| *G11C 29/52* | (2006.01) | |

(52) U.S. Cl.
CPC .......... *G11C 29/44* (2013.01); *G06F 11/1048* (2013.01); *G06F 11/1068* (2013.01); *G11C 17/16* (2013.01); *G11C 29/42* (2013.01); *G11C 29/787* (2013.01); *G11C 29/52* (2013.01); *G11C 2029/4402* (2013.01)

(58) Field of Classification Search
CPC ......... G11C 29/44; G11C 17/16; G11C 29/42; G11C 29/52; G06F 11/1068
See application file for complete search history.

(56) References Cited

U.S. PATENT DOCUMENTS

| | | | |
|---|---|---|---|
| 6,356,615 B1 * | 3/2002 | Coon .................. | G06F 11/3409 377/16 |
| 7,280,415 B2 * | 10/2007 | Hwang .................. | G11C 29/02 365/189.09 |
| 8,996,956 B2 * | 3/2015 | Yang ..................... | G11C 29/42 714/766 |
| 2001/0045581 A1 * | 11/2001 | Sakata ................. | G11C 29/785 257/236 |

(Continued)

FOREIGN PATENT DOCUMENTS

| | | |
|---|---|---|
| KR | 1020140125981 | 10/2014 |
| KR | 1020160074211 | 6/2016 |

*Primary Examiner* — Mushfique Siddique
(74) *Attorney, Agent, or Firm* — IP & T Group LLP

(57) ABSTRACT

Disclosed is a memory device including a plurality of memory cell arrays each of which includes a normal cell array and a redundant cell array, a first fuse unit including a plurality of first fuse sets corresponding to first memory cell arrays among the memory cell arrays, a second fuse unit including a plurality of second fuse sets corresponding to second memory cell arrays among the memory cell arrays, the first fuse sets corresponding to the second fuse sets, respectively, and a repair unit selecting a pair of fuse sets that correspond to each other from the first fuse sets and the second fuse sets based on information that represents whether each of the first fuse sets and the second fuse sets failed or is usable and programming a repair target column address of the memory cell arrays in the selected fuse set pair.

19 Claims, 6 Drawing Sheets

(56) References Cited

U.S. PATENT DOCUMENTS

| | | | |
|---|---|---|---|
| 2008/0279021 A1* | 11/2008 | Han | G11C 29/18 365/201 |
| 2010/0165766 A1* | 7/2010 | Jeong | G11C 8/10 365/200 |
| 2010/0309739 A1* | 12/2010 | An | G11C 29/02 365/201 |
| 2011/0158013 A1* | 6/2011 | Kim | G11C 17/16 365/200 |
| 2013/0315016 A1* | 11/2013 | Park | G11C 17/16 365/200 |
| 2013/0322160 A1* | 12/2013 | Kim | G11C 29/04 365/154 |
| 2015/0043288 A1* | 2/2015 | Kim | G11C 17/14 365/189.05 |
| 2015/0074494 A1* | 3/2015 | Shim | G11C 29/787 714/768 |
| 2016/0077940 A1* | 3/2016 | Son | G06F 11/2094 714/6.22 |
| 2016/0351276 A1* | 12/2016 | Shim | G11C 29/78 |
| 2017/0018316 A1* | 1/2017 | Kim | G11C 17/16 |
| 2017/0083398 A1* | 3/2017 | Baek | G11C 29/44 |
| 2018/0067847 A1* | 3/2018 | Oh | G11C 29/42 |
| 2018/0197621 A1* | 7/2018 | Jeong | G11C 29/76 |
| 2018/0197968 A1* | 7/2018 | Jeong | G11C 16/0475 |

* cited by examiner

REPAIR CIRCUIT USED IN A MEMORY DEVICE FOR PERFORMING ERROR CORRECTION CODE OPERATION AND REDUNDANCY REPAIR OPERATION

CROSS-REFERENCE TO RELATED APPLICATIONS

The present application claims priority of Korean Patent Application No. 10-2017-0059331, filed on May 12, 2017, which is incorporated herein by reference in its entirety.

BACKGROUND

1. Field

Exemplary embodiments of the present invention relate to a memory device. Particularly, exemplary embodiments of the present invention relate to a repair circuit for a repair operation, and a memory device including the repair circuit.

2. Description of the Related Art

A memory device, such as, e.g., a Dynamic Random Access Memory (DRAM) and a resistive memory, may include a plurality of memory cells that are arrayed in the form of a matrix. As the capacity of memory devices increases and the dimension of fabricated memory devices shrinks, the number of defective memory cells among the memory cells increases as well. In general, defective memory cells may include failed memory cells and weak memory cells. The failed memory cells may be defined as memory cells that do not function in terms of hardware. For example, the failed memory cells may be defined as the memory cells that do not operate due to a defect occurring during the semiconductor fabrication process, such as a memory cell of which the connection line is short-circuited. The weak memory cells may be defined as memory cells that do not function to the standard of satisfactory performance. For example, the weak memory cells may include a memory cell of which the data retention time does not reach a reference time.

If there is even one failed memory cell among the memory cells, the memory device including the failed memory cell ideally has to be treated as a defective memory device because the memory device may not operate properly. The memory device that is decided as a defective memory device may have to be abandoned. When all the memory devices including failed memory cells are treated as defective memory devices, the yield of the manufacturing process will drop significantly. Moreover, since the memory cells are highly integrated, and more than tens of millions of memory cells are integrated into one chip, the number of failed memory cells tends to rise despite the advances in the fabrication process.

Therefore, it is desirable to develop a method for efficiently repairing defective memory cells to improve the yield as well as realizing high integration and high speed of a memory device. One method for repairing a defective memory cell is providing a repair circuit for replacing a defective memory cell with a redundant cell inside. The repair circuit may include a fuse circuit that may program addresses corresponding to defective memory cells. Herein, "program" may mean a series of operations for storing an address corresponding to a defective memory cell in the fuse circuit.

In recent times, data retention characteristics of a memory cell tend to decrease due to the trend of low-voltage high-speed operation and shrinking fabrication dimensions that may also lead to an increase in the number of weak memory cells. In other words, the frequency that error bits occur in the data stored in a memory device is increasing drastically. To solve the problem, there is an effort for detecting and correcting the error bits through an Error Correction Code (ECC) operation in the inside of the memory device.

There may be various operation methods of performing the ECC operation, and the efficient number of parity bits may be decided based on the number of data bits and the operation method thereof. In case of a DRAM, the number of parity bits may be decided based on the number of data bits that is written/read at once and the method of the ECC operation. Also, since the amount of current consumed for an operation and the time taken for reading data are very significant performance indicators in a DRAM, current consumption and read operation characteristics may be taken into significant consideration to decide the method of the ECC operation and the number of parity bits in addition to the number of data bits that are written/read at once.

When an ECC operation is applied to a memory device, the ECC operation may also be considered to perform a repair operation of the memory device. The data unit for a repair operation may be decided based on the type of defects occurring during a fabrication process and a test operation method for efficiently detecting the defects. For example, as for a test operation for securing defect-free memory cells in a memory device, the test operation may be performed while turning off the ECC operation. During the test operation, memory cells are detected and repaired based on a data unit that is smaller than the basic data unit of the ECC operation in order to efficiently detect defects. In short, when the minimal data unit for a repair operation and the basic data unit for an ECC operation may be different from each other, or when a test operation is performed with various conditions, such as turning on/off the ECC operation, the ECC operation may be additionally considered to find a target fuse and perform a repair operation.

SUMMARY

Embodiments of the present invention are directed to a memory device that may detect and repair defective memory cells based on a data unit which may be different according to conditions.

In accordance with an embodiment of the present invention, a semiconductor device includes: a plurality of memory cell arrays each of which includes a normal cell array and a redundant cell array; a first fuse unit including a plurality of first fuse sets corresponding to first memory cell arrays among the memory cell arrays; a second fuse unit including a plurality of second fuse sets corresponding to second memory cell arrays among the memory cell arrays, the first fuse sets corresponding to the second fuse sets, respectively; and a repair unit selecting a pair of fuse sets that correspond to each other from the first fuse sets and the second fuse sets based on information that represents whether each of the first fuse sets and the second fuse sets failed or is usable and programming a repair target column address of the memory cell arrays in the selected fuse set pair.

The repair unit may include: a counting unit generating a count signal sequentially corresponding to the first fuse sets and the second fuse sets by counting a clock signal; a storage unit storing the information that represents whether each of the first fuse sets and the second fuse sets failed or is usable and outputting information of a corresponding fuse set in response to the count signal; and a control unit generating a target signal that represents the selected fuse set pair based on the information outputted from the storage unit in response to the count signal.

The counting unit may include: a counter outputting a fuse count signal by increasing a value of the fuse count signal one by one in response to the clock signal; and an encoder generating the count signal by encoding the fuse count signal.

The control unit may include: a selection signal generator generating a plurality of selection signals that respectively correspond to a plurality of pairs of fuse sets that correspond to each other from the first fuse sets and the second fuse sets; a selection signal combiner generating a latch signal by combining the selection signals in response to the count signal; and a latch generating the target signal by latching the fuse count signal in response to the latch signal.

The selection signal generator may include a plurality of signal generation elements that respectively correspond to the fuse set pairs, and each of the signal generation elements may include: a first enable element generating an enable signal of a first fuse set of a corresponding fuse set pair based on the information outputted from the storage unit in response to the count signal; a second enable element generating an enable signal of a second fuse set of the corresponding fuse set pair based on the information outputted from the storage unit in response to the count signal; and a first signal combining element generating a selection signal of the fuse set pair by combining output signals of the first enable element and the second enable element.

The selection signal combiner may include: a second signal combining element enabling an output signal according to logic levels of the selection signals in response to the count signal; and a mode selecting element selectively transferring an output signal of the second signal combining element or the information outputted from the storage unit as the latch signal in response to a mode selection signal.

The memory cell arrays each may include a plurality of memory blocks, and the first fuse sets and the second fuse sets each may include a plurality of fuse elements respectively corresponding to the memory blocks.

The counting unit may further include: a comparator generating a detection signal by comparing a repair target row address with the fuse count signal.

The selection signal combiner may further include: a latch signal generation element transferring an output signal of the mode selecting element as the latch signal in response to the detection signal.

The first enable element and the second enable element may generate an enable signal of a corresponding fuse element among the fuse elements of the first fuse sets and the second fuse sets in response to the detection signal.

A write/read operation accompanied by an Error Correction Code (ECC) operation is performed in order to detect a defect occurring in the memory cell arrays, and alternatively a write/read operation may be performed without the ECC operation in order to detect a defect occurring in either the first memory cell arrays or the second memory cell arrays, separately.

A defect occurring in either the first memory cell arrays or the second memory cell arrays may be detected by using a data unit of ½*N bits, when the defect occurring in the memory cell arrays is detected by using a data unit of N bits, where N is a natural number.

In accordance with another embodiment of the present invention, a repair circuit includes: a plurality of first fuse sets corresponding to first memory cell arrays among a plurality of memory cell arrays; a plurality of second fuse sets corresponding to second memory cell arrays among the memory cell arrays and forming a plurality of fuse set pairs respectively corresponding to the first fuse sets; a storage unit storing information that represents whether each of the first fuse sets and the second fuse sets failed or is usable; and a control unit selecting one fuse set pair among the fuse set pairs based on the information stored in the storage unit and outputting a target signal.

The repair circuit may further include: a counting unit generating a count signal sequentially corresponding to the first fuse sets and the second fuse sets by counting a clock signal.

The storage unit may transfer information of a corresponding fuse set among the first fuse sets and the second fuse sets to the control unit in response to the count signal.

The control unit may include: a selection signal generator generating a plurality of selection signals that respectively correspond to the fuse set pairs; a selection signal combiner generating a latch signal by combining the selection signals in response to the count signal; and a latch generating the target signal by latching the count signal in response to the latch signal.

The selection signal generator may include a plurality of signal generation elements that respectively correspond to the fuse set pairs, and each of the signal generation elements may include: a first enable element generating an enable signal of a first fuse set of a corresponding fuse set pair based on the information stored in the storage unit in response to the count signal; a second enable element generating an enable signal of a second fuse set of the corresponding fuse set pair based on the information stored in the storage unit in response to the count signal; and a first signal combining element generating a selection signal of the fuse set pair by combining output signals of the first enable element and the second enable element.

The selection signal combiner may include: a second signal combining element enabling an output signal according to logic levels of the selection signals in response to the count signal; and a mode selecting element selectively transferring an output signal of the second signal combining element or the information stored in the storage unit as the latch signal in response to a mode selection signal.

In an Error Correction Code (ECC)-on mode, when a failure is detected from the memory cell arrays, a corresponding fuse set pair among the fuse set pairs may be used or indicated as a fail.

In an Error Correction Code (ECC)-off mode, when a failure is detected from the first memory cell arrays or the second memory cell arrays, a corresponding fuse set among the first fuse sets and the second fuse sets may be used or indicated as a fail.

DETAILED DESCRIPTION

Figure 1:
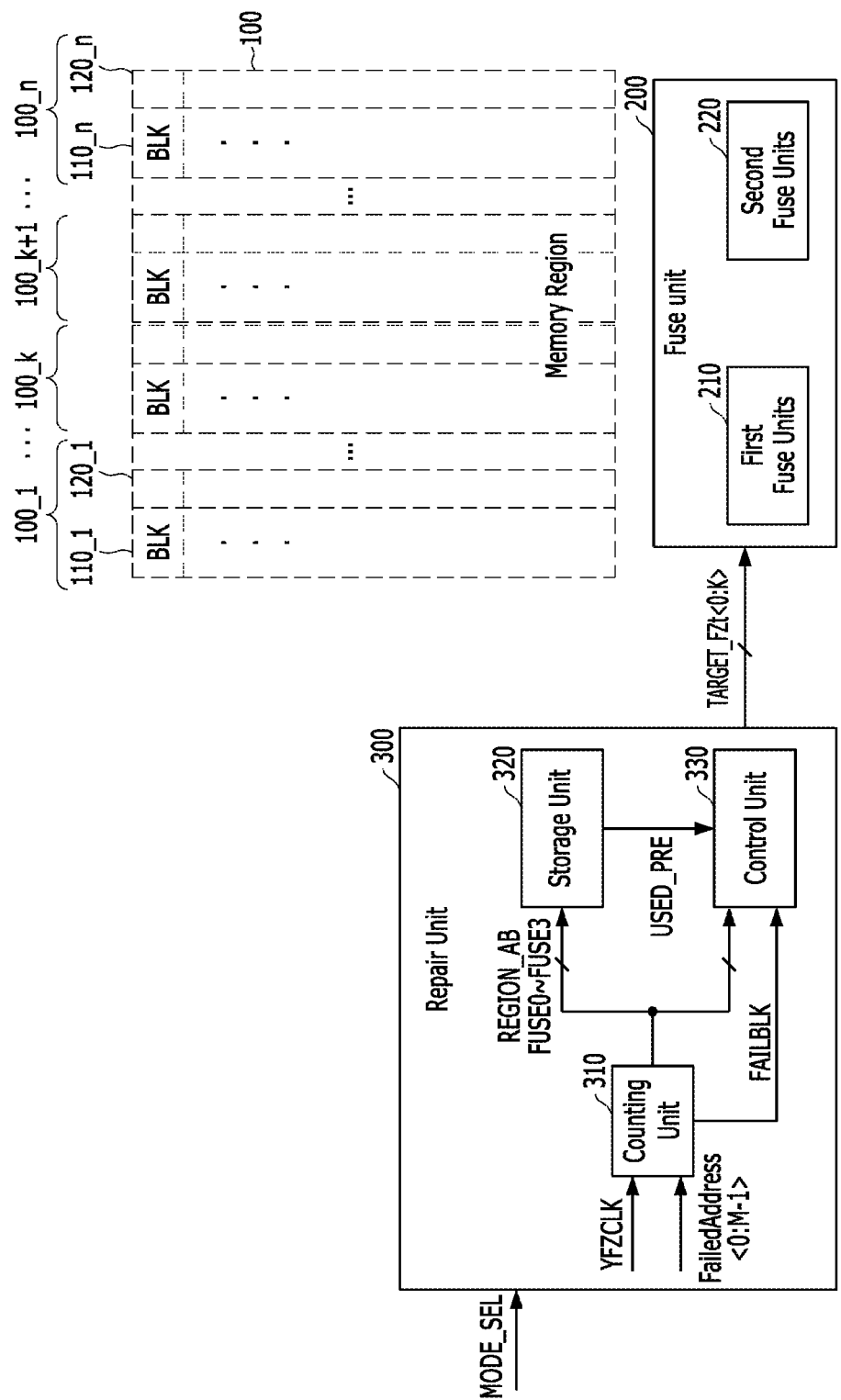
FIG. 1 is a block diagram illustrating a memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory device in accordance with an embodiment of the present invention.

FIG. 1 shows a memory device including a memory region 100 and a repair circuit, which may include a fuse unit 200 and a repair unit 300. The memory region 100 may include a plurality of memory cells, and the repair circuit may repair defective memory cells among the memory cells of the memory region 100.

The memory region 100 may include a plurality of memory cell arrays 100_1 to 100_n. Each of the memory cell arrays 100_1 to 100_n may include normal cell arrays 110_1 to 110_n and redundant cell arrays 120_1 to 120_n corresponding to the normal cell arrays 110_1 to 110_n. The redundant cell arrays 120_1 to 120_n may include redundant cells that are arrayed in redundant rows and redundant columns.

The memory device may be adapted to repair defects occurring in response to an active/precharge command by using a redundant row, and be adapted to repair defects occurring in response to a write/read command by using a redundant column. According to one embodiment of the present invention, the redundant cell arrays 120_1 to 120_n may include redundant columns that are formed of redundant cells to repair defects occurring in response to a write/read command, which is relevant to ECC operations.

The memory device may be adapted to input/output N-bit data through the memory cell arrays 100_1 to 100_n during a one-time write/read operation. In this case, an ECC operation or a column repair operation according to the write/read operation may be performed based on an N-bit data unit. However, the column repair operation according to a test operation during a semiconductor fabrication process may be performed while the ECC operation is turned off in order to secure defect-free memory cells, or may be performed based on a data unit that is smaller than N bits to increase the efficiency.

For example, the column repair operation of the memory device shown in FIG. 1 may be performed based on a unit of K bits (where K=½×N). In other words, a repair operation may be performed by dividing the memory cell arrays 100_1 to 100_n in half. In this case, the fuse unit 200 may include a first fuse unit 210 and a second fuse unit 220. The first fuse unit 210 may correspond to first memory cell arrays 100_1 to 100_k among the memory cell arrays 100_1 to 100_n, and the second fuse unit 220 may correspond to the other memory cell arrays 100_k+1 to 100_n, which are second memory cell arrays 100_k+1 to 100_n, among the memory cell arrays 100_1 to 100_n.

Figure 2:
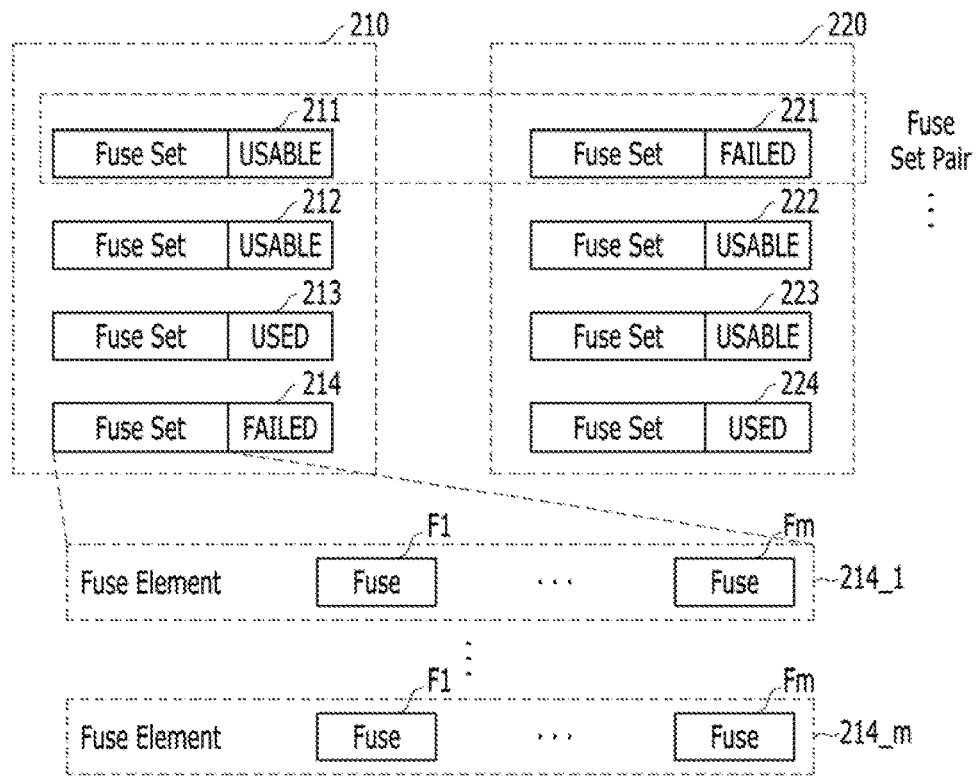
FIG. 2 is a block diagram illustrating a configuration of first and second fuse units shown in FIG. 1.

FIG. 2 is a block diagram illustrating a configuration of the first and second fuse units 210 and 220 shown in FIG. 1. FIG. 2 shows that the first fuse unit 210 and the second fuse unit 220 include four fuse sets 211 to 214 and 221 to 224, respectively. The configuration is designed for programming, for example, four repair target column addresses for each memory block BLK. The given configuration is merely exemplary, and the scope and concept of the present invention are not limited to the structure. Accordingly, it should be noted that any suitable number of fuse sets may be included in one fuse unit, and also any suitable number of fuse units may be included in a fuse array.

Also, each of the fuse sets 211 to 214 and 221 to 224 may include a plurality of fuse elements 214_1 to 214_m corresponding to memory blocks BLK. Each of the fuse elements 214_1 to 214_m may include a plurality of fuses F1 to Fm that correspond to each bit of a repair target column address. Hereafter, for the sake of convenience in description, whether the fuse sets 211 to 214 and 221 to 224 are usable or failed will be described only for one memory block BLK, that is, one fuse element.

The fuse sets 211 to 214 of the first fuse unit 210 and fuse sets 221 to 224 of the second fuse unit 220 may be individually used or treated as a failed fuse set according to a test operation and a repair operation. In other words, the fuse sets 211 to 214 of the first fuse unit 210 may individually be used or treated as failed fuse sets through a test for the first memory cell arrays 100_1 to 100_k among the memory cell arrays 100_1 to 100_n. Likewise, the fuse sets 221 to 224 of the second fuse unit 220 may individually be used or treated as failed fuse sets through a test for the second memory cell arrays 100_k+1 to 100_n among the memory cell arrays 100_1 to 100_n.

For example, as illustrated in FIG. 2, when a defect occurs in the normal cell arrays 110_1 to 110_k of the first memory cell arrays 100_1 to 100_k, the third fuse set 213 of the first fuse unit 210 may be used. Also, when a defect occurs in the redundant cell arrays 120_1 to 120_k of the first memory cell arrays 100_1 to 100_k, the fourth fuse set 214 of the first fuse unit 210 may be treated as a failed fuse set. Likewise, due to respective defects occurring in the normal cell arrays 110_k+1 to 110_n and the redundant cell arrays 120_k+1 to 120_n of the second memory cell arrays 100_k+1 to 100_n, the fourth and first fuse sets 224 and 221 of the second fuse unit 220 may be used and treated as failed fuse sets.

However, as described above, the fuse sets 211 to 214 of the first fuse unit 210 and fuse sets 221 to 224 of the second fuse units 220 may also be tested based on an N-bit unit for a column repair operation according to a write/read operation accompanied by an ECC operation. To that end, for example, two fuse sets of the N-bit unit may be selected and tested. In this case, a pair of tested fuse sets may be used for a column repair operation, too. The use of the pair of tested fuse sets will be described in more detail below.

There may be various operation methods for performing an ECC operation. It may be assumed in this embodiment of the present invention that the memory device of FIG. 1 uses an ECC operation method of performing an error correction when a 1-bit error occurs, while detecting a multi-bit error when an error of more than 2 bits occurs. Herein, when a 2-bit error is detected through the ECC operation performed for a written/read data operation, the error that has occurred may be one among the following three cases.

Case 1—When a 2-bit error occurs in the first memory cell arrays 100_1 to 100_k

Case 2—When a 1-bit error occurs in the first memory cell arrays 100_1 to 100_k, and a 1-bit error occurs in the second memory cell arrays 100_k+1 to 100_n Case 3—When a 2-bit error occurs in the second memory cell arrays 100_k+1 to 100_n As for Case 1 and Case 3 among the cases described above, a repair operation may be performed independently for the first memory cell arrays 100_1 to 100_k and the second memory cell arrays 100_k+1 to 100_n. However, since error bits are not detected from the actual data but from the data that are processed and changed through an ECC operation for all the Case 1, Case 2, and Case 3, it is difficult to figure out the region in which an error has actually occurred.

Therefore, a test operation may be performed on a pair of fuse sets including the fuse sets that are selected from the first fuse unit 210 and the second fuse unit 220, respectively, in order to perform a column repair operation according to a write/read operation accompanied by an ECC operation. However, because the test operation may be performed on a pair of fuse sets, there may be additional considerations to take while the column repair operation is performed.

As illustrated in FIG. 2, multiple fuse sets that respectively belong to the first fuse unit 210 and the second fuse unit 220, such as, e.g., the first fuse sets 211 and 221, may form a pair of fuse sets. In one embodiment, fuse sets may be paired by selecting one fuse set from each of the fuse units 210 and 220. For example, adjacent fuse sets, such as first fuse sets 211 and 221 may be paired. Based on the formed pair of fuse sets, error in the redundant cell arrays 120_1 to 120_n corresponding to the pair of the fuse sets may be detected through a test operation. Herein, when a 1-bit error occurs in either one redundant cell array 120_1 to 120_k or 120_k+1 to 120_n corresponding to one fuse set of the pair of the fuse sets, the pair of the fuse sets may be decided as usable fuse sets through the ECC operation.

For example, even if a 1-bit error occurs in the redundant cell arrays 120_1 to 120_k corresponding to the fuse set 211, it may be decided that the pair of the fuse sets 211 and 221 are usable fuse sets. Likewise, when the second fuse sets 212 and 222 form a pair of fuse sets and go through a test operation, even if a 1-bit error occurs in the redundant cell arrays 120_k+1 to 120_n corresponding to the fuse set 222, the pair of the fuse sets 212 and 222 may also be decided as usable fuse sets. However, when the fuse set 211 and the fuse set 222 are combined and used during a column repair operation, an error may be detected again due to the redundant cell arrays having a 2-bit error. In order to prevent a 2-bit error from being detected in a fuse set pair including the combined fuse sets that individually have been decided as usable, fuse sets may have to be selected from each of the first fuse unit 210 and the second fuse unit 220 for a column repair operation as those fuse sets have been selected for a test operation.

According to one embodiment of the present invention, a method for detecting a target fuse for a repair operation is described in detail by referring to FIG. 1. As shown in FIG. 2, it is exemplarily described that each of the first fuse unit 210 and the second fuse unit 220 includes four fuse sets 211 to 214 and 221 to 224, respectively.

Referring to FIG. 1, the repair unit 300 may include a counting unit 310, a storage unit 320, and a control unit 330. The repair unit 300 may select a target fuse set among the first and second fuse sets 211 to 214 and 221 to 224 that are included in the first fuse unit 210 and the second fuse unit 220 and program a repair target column address of the memory cell arrays 100_1 to 100_n.

The repair unit 300 may select a pair of fuse sets, which correspond to each other, from the first and second fuse sets 211 to 214 and 221 to 224 as target fuse sets based on the information on whether each of the first and second fuse sets 211 to 214 and 221 to 224 has failed or is usable. Herein, through repair test operations, the first and second fuse sets 211 to 214 and 221 to 224 may be tested individually or corresponding $K^{th}$ fuse sets may form a pair and be tested. Also, based on a mode selection signal MODE_SEL, the repair unit 300 may select one fuse set among the first and second fuse sets 211 to 214 and 221 to 224 as a target fuse set, which will be described in more detail below with reference to FIG. 6.

The counting unit 310 may count a clock signal YFZCLK and generate count signals REGION_AB and FUSE0 to FUSE3, which sequentially correspond to the first and second fuse sets 211 to 214 and 221 to 224. The count signals REGION_AB and FUSE0 to FUSE3 may include a first count signal REGION_AB for distinguishing the first fuse unit 210 and the second fuse unit 220, and second count signals FUSE0 to FUSE3 corresponding to the fuse sets 211 to 214 and 221 to 224. The first and second count signals REGION_AB and FUSE0 to FUSE3 may be sequentially enabled according to a counting operation of the counting unit 310.

According to one embodiment of the present invention, when the memory cell arrays 100_1 to 100_n include a plurality of memory blocks BLK, the first and second fuse sets 211 to 214 and 221 to 224 may include a plurality of fuse elements corresponding to each memory block BLK. The counting unit 310 may generate a detection signal FAILBLK that represents a fuse element corresponding to a memory block having a defect that has occurred among the memory blocks BLK based on a repair target row address FailedAddress<0:M−1>.

The storage unit 320 may store information representing whether each of the first and second fuse sets 211 to 214 and 221 to 224 has failed or is usable. The first and second fuse sets 211 to 214 and 221 to 224 may be used to replace a normal cell having a defect that has occurred with a corresponding redundant cell, or may be treated as a fail since a defect occurs in the corresponding redundant cell, through a test performed during the semiconductor fabrication process. The storage unit 320 may store information that represents the statuses of the first and second fuse sets 211 to 214 and 221 to 224 (or the fuse elements included in the first and second fuse sets 211 to 214 and 221 to 224) and output fuse set information USED_PRE of the corresponding fuse set in response to the count signals REGION_AB and FUSE0 to FUSE3.

The control unit 330 may select a pair of fuse sets that correspond to each other from the first and second fuse sets 211 to 214 and 221 to 224 based on the information outputted from the control unit 330 in response to the count signals REGION_AB and FUSE0 to FUSE3. The control unit 330 may generate a target signal TARGET_FZt<0:K> that represents the selected pair of fuse sets. The operation of the control unit 330 is described below in more detail with reference to FIGS. 4 to 6.

Figure 3:
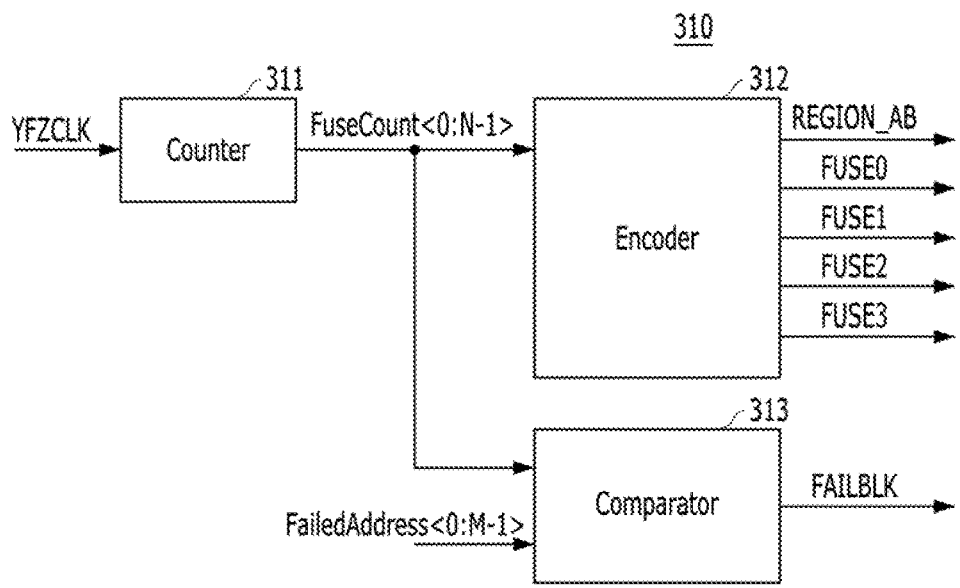
FIG. 3 is a block diagram illustrating a configuration of a counting unit shown in FIG. 1.

FIG. 3 is a block diagram illustrating a configuration of the counting unit 310 shown in FIG. 1. According to one embodiment of the present invention, the counting unit 310 may include a counter 311 and an encoder 312.

The counter 311 may output a fuse count signal FuseCount<0:N−1> by increasing the value of the fuse count signal FuseCount<0:N−1> one by one. As illustrated in FIG. 2, each of the fuse sets 211 to 214 and 221 to 224 may include at least one fuse element. When each of the fuse sets 211 to 214 and 221 to 224 includes a plurality of fuse elements, the fuse count signal FuseCount<0:N−1> may be increased one by one to correspond to the fuse sets 211 to 214 and 221 to 224 and each of the fuse elements. In other words, the value of the fuse count signal FuseCount<0:N−1> may be increased one by one from the first fuse element, e.g., the first fuse element 211_1 of the first fuse set 211 to the last fuse element, e.g., the last fuse element 224_m of the second fuse set 224. In one embodiment, when each of the fuse sets 211 to 214 and 221 to 224 includes only one fuse element, the fuse count signal FuseCount<0:N−1> may be increased one by one to correspond to each of the fuse sets 211 to 214 and 221 to 224.

The encoder 312 may generate the first count signal REGION_AB and the second count signals FUSE0 to FUSE3 by encoding the fuse count signal FuseCount<0:N−1>. Through the encoding operation, the encoder 312 may generate the first count signal REGION_AB in which the logic level is changed from a first logic level to a second logic level, and the second count signals FUSE0 to FUSE3 that are sequentially enabled from the logic level of the first count signal REGION_AB.

According to one embodiment of the present invention, the counting unit 310 may further include a comparator 313. The comparator 313 may generate the detection signal FAILBLK by comparing the repair target row address FailedAddress<0:M−1> with the fuse count signal FuseCount<0:N−1>. According to one embodiment of the present invention, when the memory cell arrays 100_1 to 100_n include a plurality of memory blocks BLK, the first and second fuse sets 211 to 214 and 221 to 224 may include a plurality of fuse elements that respectively correspond to the memory blocks BLK. Therefore, the repair target row address FailedAddress<0:M−1> may represent a memory block in which a defect has occurred among the memory blocks BLK, and when the fuse count signal FuseCount<0:N−1> represents a corresponding fuse element among the fuse elements in each of the fuse sets 211 to 214 and 221 to 224, the comparator 313 may enable the detection signal FAILBLK.

Figure 4:
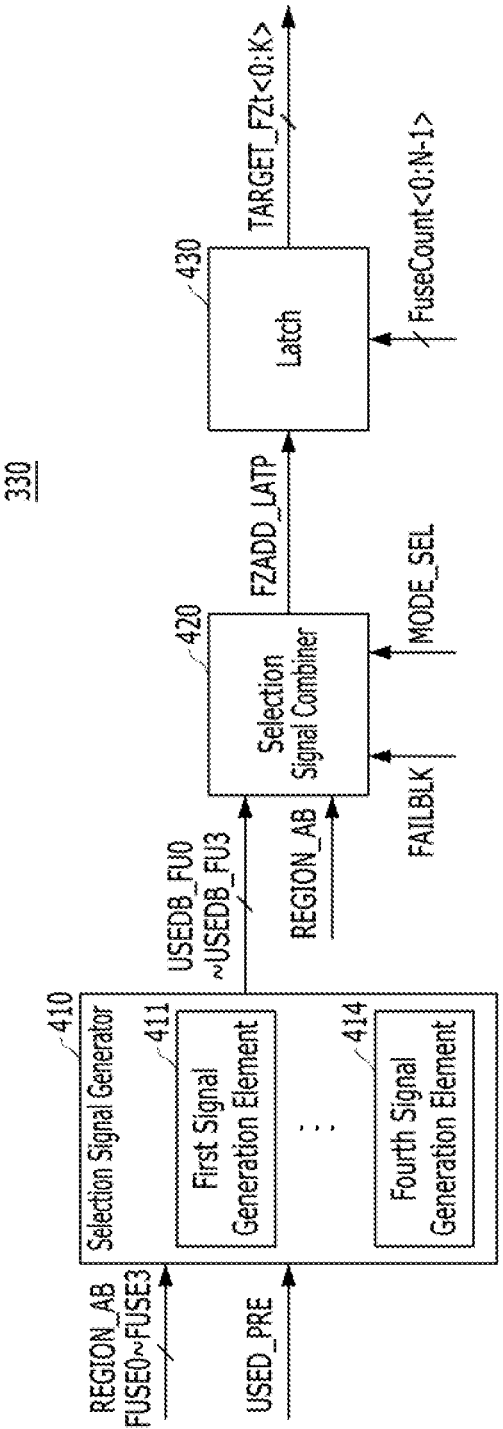
FIG. 4 is a block diagram illustrating a configuration of a control unit shown in FIG. 1.

FIG. 4 is a block diagram illustrating a configuration of the control unit 330 shown in FIG. 1. According to one embodiment of the present invention, the control unit 330 may include a selection signal generator 410, a selection signal combiner 420, and a latch 430.

In response to the first and second count signals REGION_AB and FUSE0 to FUSE3, the selection signal generator 410 may generate a plurality of selection signals USEDB_FU0 to USEDB_FU3 that respectively correspond to a plurality of pairs of fuse sets that correspond to each other among the first and second fuse sets 211 to 214 and 221 to 224 based on the information USED_PRE outputted from the storage unit 320. In other words, the selection signal generator 410 may generate the first to fourth selection signals USEDB_FU0, USEDB_FU1, USEDB_FU2, and USEDB_FU3 corresponding to first to fourth fuse set pairs 211 and 221, 212 and 222, 213 and 223, and 214 and 224, respectively. The selection signal generator 410 may include first to fourth signal generation elements 411 to 414 that correspond to the first to fourth fuse set pairs 211 and 221, 212 and 222, 213 and 223, and 214 and 224, respectively. The first to fourth signal generation elements 411 to 414 may output the first to fourth selection signals USEDB_FU0, USEDB_FU1, USEDB_FU2, and USEDB_FU3, respectively.

The selection signal combiner 420 may generate a latch signal FZADD_LATP in response to the first count signal REGION_AB by combining the first to fourth selection signals USEDB_FU0, USEDB_FU1, USEDB_FU2, and USEDB_FU3. When the first count signal REGION_AB is in a second logic level, e.g., when the first count signal REGION_AB is in a logic high level, the latch signal FZADD_LATP may be enabled according to the logic level of the first to fourth selection signals USEDB_FU0, USEDB_FU1, USEDB_FU2, and USEDB_FU3.

The latch 430 may generate the target signal TARGET_FZt<0:K> in response to the latch signal FZADD_LATP by latching the fuse count signal FuseCount<0:N−1>. The latch 430 may output the value of the fuse count signal FuseCount<0:N−1> when the latch signal FZADD_LATP is enabled as the target signal TARGET_FZt<0:K>.

Figure 5:
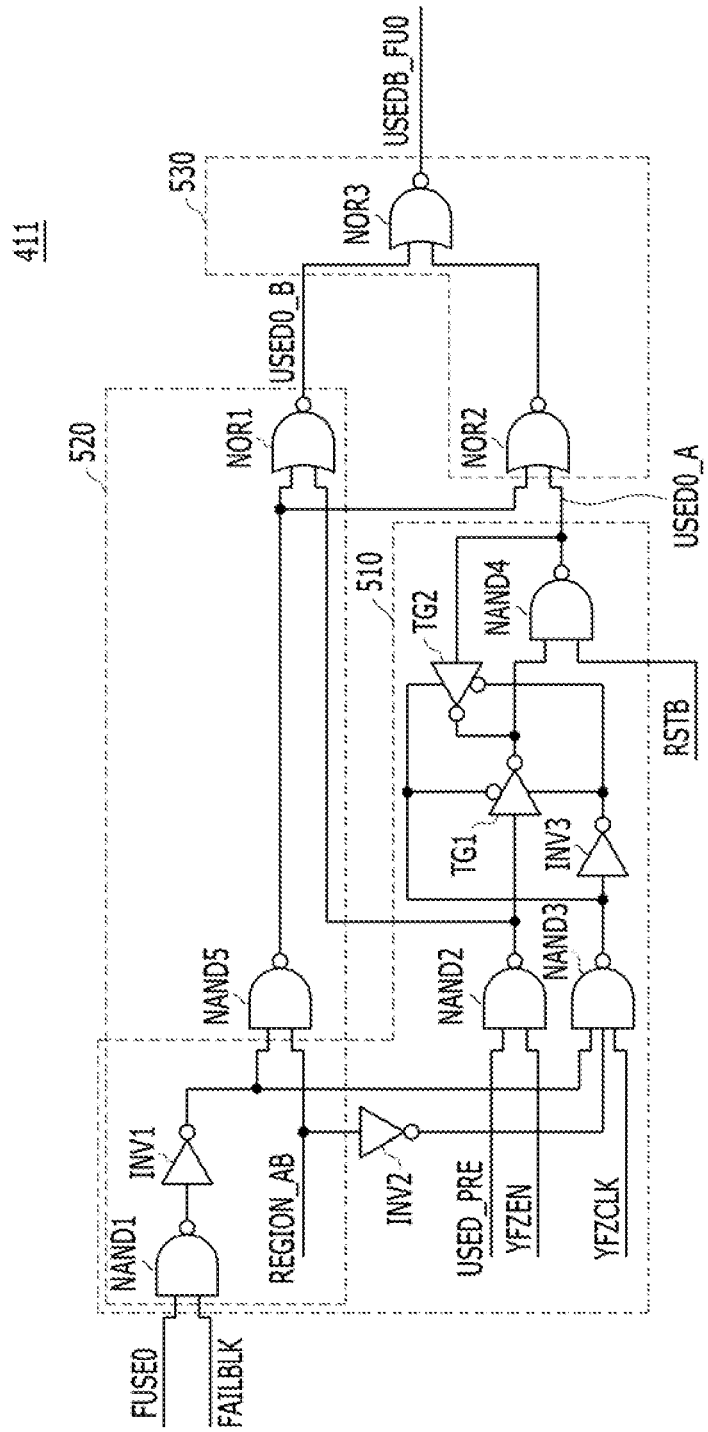
FIG. 5 is a circuit diagram illustrating a specific configuration of a first signal generation element shown in FIG. 4.

FIG. 5 is a circuit diagram illustrating an exemplary configuration of the first to fourth signal generation elements 411 to 414 shown in FIG. 4. The first to fourth signal generation elements 411 to 414 may have the same configuration only with different input signals. Thus, only the first signal generation element 411 is representatively illustrated in FIG. 5.

The first signal generation element 411 may include a first enable element 510, a second enable element 520, and a first signal combining element 530.

The first enable element 510 may generate an enable signal USED0_A corresponding to the first fuse set 211 among the first fuse set pair 211 and 221 based on the fuse set information USED_PRE outputted from the storage unit 320 in response to the count signals REGION_AB and FUSE0. In other words, the count signals REGION_AB and FUSE0 may be enabled corresponding to the first fuse set 211, and the first enable element 510 may generate the enable signal USED0_A of the first fuse set 211 based on the fuse set information USED_PRE that represents whether the first fuse set 211 has failed or is usable.

When the first fuse set 211 includes a plurality of fuse elements, the first enable element 510 may further receive the detection signal FAILBLK from the comparator 313. The first enable element 510 may generate the enable signal USED0_A for the fuse element of the first fuse set 211 based on the detection signal FAILBLK. According to one embodiment of the present invention, the first enable element 510 may include NAND gates NAND1 to NAND4, inverters INV1 to INV3, and transfer gates TG1 and TG2.

The second enable element 520 may generate an enable signal USED0_B corresponding to the second fuse set 221 among the first fuse set pair 211 and 221 based on the fuse set information USED_PRE outputted from the storage unit 320 in response to the count signals REGION_AB and FUSE0. In other words, the count signals REGION_AB and FUSE0 may be enabled corresponding to the second fuse set 221, and the second enable element 520 may generate the enable signal USED0_B of the second fuse set 221 based on the fuse set information USED_PRE that represents whether the second fuse set 221 has failed or is usable.

When the second fuse set 221 includes a plurality of fuse elements, the second enable element 520 may further receive the detection signal FAILBLK from the comparator 313. The second enable element 520 may generate the enable signal USED0_B for the fuse element of the second fuse set 221 based on the detection signal FAILBLK. According to one embodiment of the present invention, the second enable element 520 may include NAND gates NAND1 and NAND5, an inverter INV1, and a NOR gate NOR1. The second enable element 520 may share the inverter INV1 and the NOR gate NOR1 with the first enable element 510.

The first signal combining element 530 may generate the first selection signal USEDB_FU0 of the first fuse set pair 211 and 221 by combining the enable signals USED0_A and USED0_B. When all the fuse sets of the first fuse set pair 211 and 221 are usable, the first signal combining element 530 may enable the first selection signal USEDB_FU0 to a logic high level. According to one embodiment of the present invention, the first signal combining element 530 may include NOR gates NOR2 and NOR3.

Figure 6:
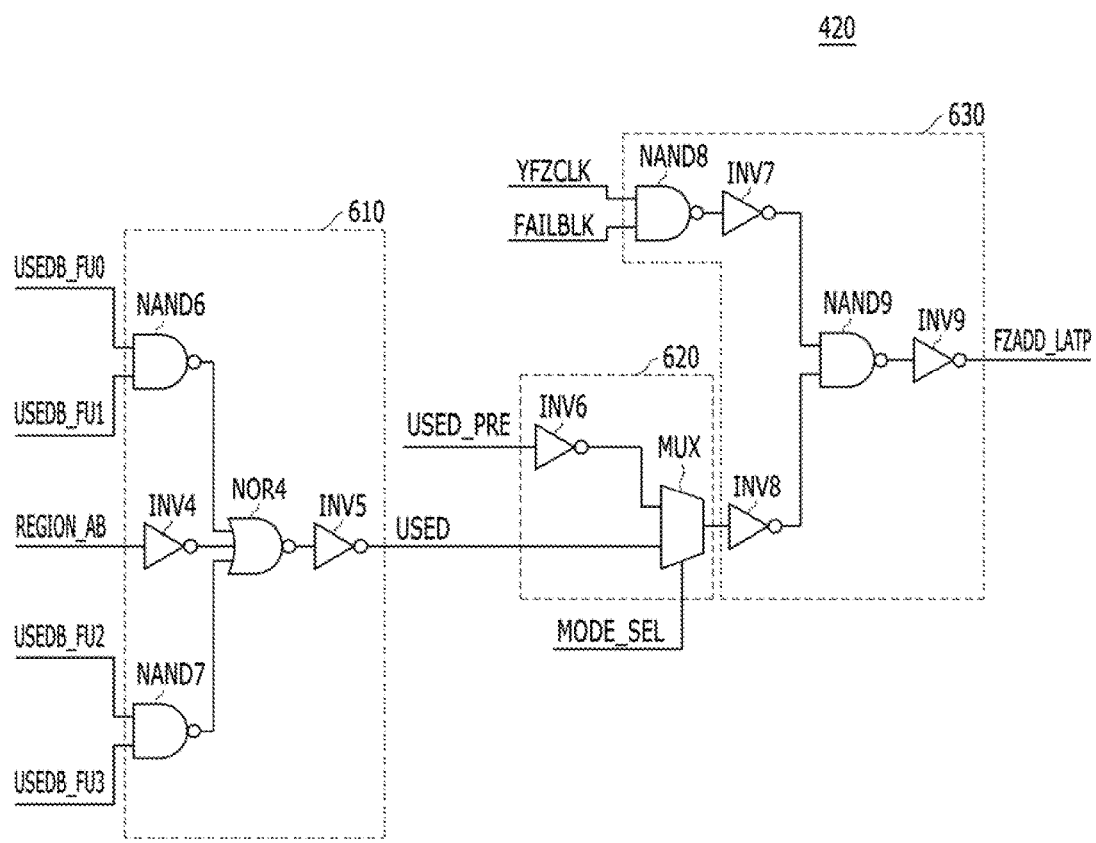
FIG. 6 is a circuit diagram illustrating a specific configuration of a selection signal combiner shown in FIG. 4.

FIG. 6 is a circuit diagram illustrating an exemplary configuration of the selection signal combiner 420 shown in FIG. 4. The selection signal combiner 420 may include a second signal combining element 610 and a mode selecting element 620.

When the first count signal REGION_AB is in a second logic level, e.g., when the first count signal REGION_AB is in a logic high level, the second signal combining element 610 may enable an output signal USED according to the logic levels of the first to fourth selection signals USEDB_FU0, USEDB_FU1, USEDB_FU2, and USEDB_FU3. When the first to fourth selection signals USEDB_FU0, USEDB_FU1, USEDB_FU2, and USEDB_FU3 are all in a logic high level, the second signal combining element 610 may enable the output signal USED to a second logic level, which is, e.g., a logic low level. According to one embodiment of the present invention, the second signal combining element 610 may be formed of NAND gates NAND6 and NAND7, inverters INV4 and INV5, and a NOR gate NOR4.

The mode selecting element 620 may selectively transfer the output signal USED of the second signal combining element 610 and the fuse set information USED_PRE outputted from the storage unit 320 in response to a mode selection signal MODE_SEL. In other words, when the mode selection signal MODE_SEL is '1', the mode selecting element 620 may output the output signal USED of the second signal combining element 610 as it is, and when the mode selection signal MODE_SEL is '0', the mode selecting element 620 may output the fuse set information USED_PRE outputted from the storage unit 320 as it is. According to one embodiment of the present invention, the mode selecting element 620 may include an inverter INV6 and a multiplexer MUX.

Therefore, when the mode selection signal MODE_SEL is '1', the selection signal combiner 420 may generate the target signal TARGET_FZt<0:K> based on the signal USED generated by deciding whether fuse sets of the first to fourth fuse set pairs 211 and 221, 212 and 222, 213 and 223, and 214 and 224 are usable or not. On the other hand, when the mode selection signal MODE_SEL is '0', the selection signal combiner 420 may generate the target signal TARGET_FZt<0:K> based on the fuse set information USED_PRE representing whether each of the first and second fuse sets 211 to 214 and 221 to 224 is usable or not. After all, a corresponding fuse set pair may be selected from the first and second fuse sets 211 to 214 and 221 to 224 according to the mode of the memory device and programmed, or one fuse set may be selected from the first and second fuse sets 211 to 214 and 221 to 224 according to the mode of the memory device and programmed.

According to one embodiment of the present invention, the selection signal combiner 420 may further include a latch signal generation element 630. The latch signal generation element 630 may transfer an output signal of the mode selecting element 620 as the latch signal FZADD_LATP, when the detection signal FAILBLK is in a logic high level. In short, when the detection signal FAILBLK is in a logic high level and the output signal of the mode selecting element 620 is enabled to a logic low level, the latch signal generation element 630 may enable the latch signal FZADD_LATP to a logic high level. The latch signal generation element 630 may operate in synchronization with the clock signal YFZCLK, and it may include NAND gates NAND8 and NAND9, and inverters INV7 to INV9.

Figure 7:
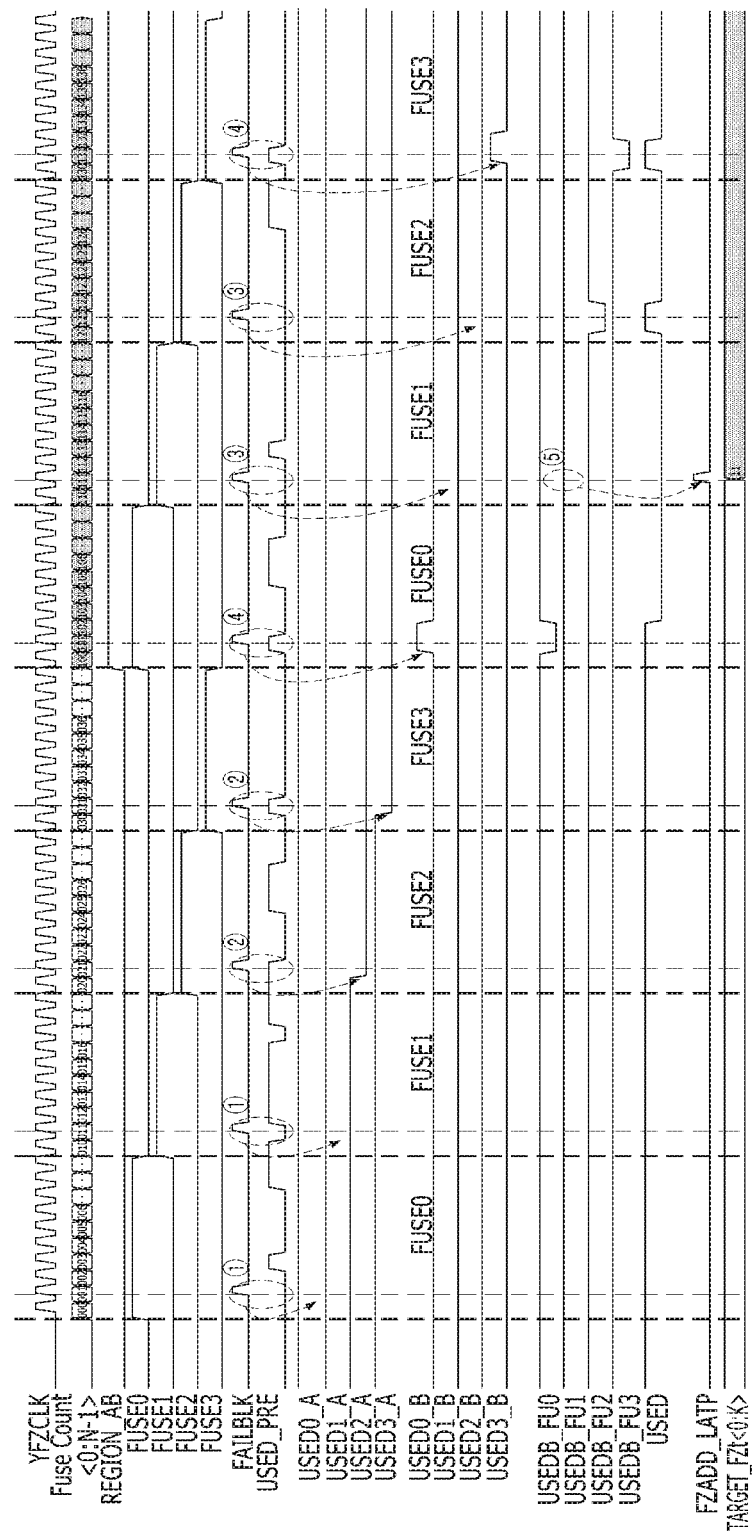
FIG. 7 is a waveform diagram of a signal generated from an operation of the memory device shown in FIG. 1.

FIG. 7 is a waveform diagram of signals generated by an operation of the memory device shown in FIG. 1.

FIG. 7 shows an exemplary embodiment where a defect occurs in the second memory block among the memory blocks BLK of the memory region 100. In other words, the counting unit 310 may enable the detection signal FAILBLK in synchronization with the values 001, 011, 021, 031, 101, 111, 121 and 131 corresponding to the second fuse element of the fuse sets 211 to 214 and 221 to 224 among the values of the fuse count signal FuseCount<0:N−1> in response to a repair target row address FailedAddress<1>. Therefore, an operation on the second fuse element according to one embodiment will be described, which may apply to other fuse elements of the fuse sets 211 to 214 and 221 to 224 in the same manner.

The first to fourth signal generation elements 411 to 414 may be sequentially enabled according to the first count signal REGION_AB of a logic low level and the second count signals FUSE0 to FUSE3 that are enabled sequentially. In other words, the first enable element 510 may be sequentially enabled and thereby an enable signal of the corresponding first fuse set may be generated based on the fuse set information USED_PRE outputted from the storage unit 320.

Referring to FIG. 7, the information USED_PRE that represents whether each of the first and second fuse sets 211 to 214 and 221 to 224 has failed or is used may be set to a logic high level, when the corresponding fuse set is treated as a defect or being used, and when the fuse set is usable, it may be set to a logic low level. Therefore, enable signals USED0_A and USED1_A of the first fuse set 211 and 212 may be generated in a logic high level based on the information USED_PRE having a logic low level (①), and enable signals USED2_A and USED3_A of the first fuse set 213 and 214 may be generated in a logic low level based on the information USED_PRE having a logic high level (②).

According to a counting operation of the counting unit 310, the first count signal REGION_AB may transition from a logic low level to a logic high level, and the second count signals FUSE0 to FUSE3 may be sequentially enabled again. Therefore, the second enable element 520 of each of the first to fourth signal generation elements 411 to 414 may be sequentially enabled and generate an enable signal of the corresponding second fuse set based on the information USED_PRE outputted from the storage unit 320.

In accordance with one embodiment, enable signals USED1_B and USED2_B of the second fuse sets 222 and 223 may be generated in a logic low level based on the information USED_PRE having a logic low level (③). Also, enable signals USED0_B and USED3_B of the second fuse sets 222 and 223 may be generated in a logic high level based on the information USED_PRE having a logic high level (④). In short, the timing diagram of FIG. 7 illustrates an exemplary embodiment where the first fuse sets 211 and 212 and the second fuse sets 222 and 223 are usable, as shown in FIG. 2.

The first signal combining elements 530 of the first to fourth signal generation elements 411 to 414 may generate the first to fourth selection signals USEDB_FU0 to USEDB_FU3 by combining first enable signals USED0_A to USED3_A with second enable signals USED0_B to USED3_B. The first to fourth selection signals USED-B_FU0 to USEDB_FU3 may be outputted in a logic high level, when the corresponding enable signals USED0_A~USED0_B to USED3_A~USED3_B.

Therefore, in response to the first enable signal USED1_A having a logic high level corresponding to the usable first fuse set 212 and the second enable signal USED1_B having a logic low level corresponding to the usable second fuse set 222, the second selection signal USEDB_FU1 may have a logic high level (⑤). On the other hand, the corresponding levels (see the dotted lines) of the first, third, and fourth selection signals USEDB_FU0, USEDB_FU2, and USEDB_FU3 have a logic low level. Therefore, in response to the second selection signals USEDB_FU1 of a logic high level, the corresponding level of the output signal USED of the second signal combining element 610 may be a logic low level.

In accordance with one embodiment, when the mode selection signal MODE_SEL inputted to the mode selecting element 620 is of a logic high level, the output signal USED may be transferred to the latch signal generation element 630, and the latch signal generation element 630 may enable the latch signal FZADD_LATP to a logic high level based on the detection signal FAILBLK. Also, when the latch signal FZADD_LATP is enabled, the latched fuse count signal FuseCount<0:N−1> may be outputted as a target signal TARGET_FZt<0: K>.

After all, the repair unit 300 in the waveform diagram of FIG. 7 may output a count 11 corresponding to the second fuse element of the second fuse set 222 as the target signal TARGET_FZt<0:K>. Therefore, the repair target column address may be programmed in the second fuse pair that includes the second fuse set 222.

On the other hand, when the mode selection signal MODE_SEL is of a logic low level, the mode selecting element 620 may transfer the information USED_PRE outputted from the storage unit 320 to the latch signal generation element 630, and the latch signal generation element 630 may enable the latch signal FZADD_LATP to a logic high level according to the fuse set having the information USED_PRE of the logic low level based on the detection signal FAILBLK. According to the operation shown in the timing diagram of FIG. 7, the latch signal FZADD_LATP may be enabled corresponding to the second fuse element of the first fuse set 211, and thus a count 01 corresponding thereto may be outputted as the target signal TARGET_FZt<0:K>. In other words, when the mode selection signal MODE_SEL is of a logic low level, the repair unit 300 may program the repair target column address only for the fuse set corresponding to the target signal TARGET_FZt<0:K>.

According to exemplary embodiments of the present invention, the minimal unit for a column repair operation may be decided to be different from the unit for an Error Correction Code (ECC) operation in a memory device performing the ECC operation. Therefore, a test operation may be performed based on various units according to the fabrication process or the conditions such as turning on/off the ECC operation, which contributes to increasing the efficiency. Also, although the minimal unit for the column repair operation is different from the unit for the ECC operation, it is possible to quickly find out target memory cells for replacing the memory cells that are detected as defective memory cells during the ECC operation.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a plurality of memory cell arrays each of which includes a normal cell array and a redundant cell array;
   a first fuse unit including a plurality of first fuse sets corresponding to first memory cell arrays among the memory cell arrays;
   a second fuse unit including a plurality of second fuse sets corresponding to second memory cell arrays among the memory cell arrays, the first fuse sets corresponding to the second fuse sets, respectively; and
   a repair unit selecting a pair of fuse sets that correspond to each other from the first fuse sets and the second fuse sets based on information that represents whether each of the first fuse sets and the second fuse sets failed or is usable and programming a repair target column address of the memory cell arrays in the selected fuse set pair,
   wherein the repair unit selects the pair of fuse sets or one fuse set from the first fuse sets and the second fuse sets according to a mode of the memory device,
   wherein in an Error Correction Code (ECC)-on mode, when a defect is detected from the memory cell arrays, a corresponding fuse set pair among pairs of the first fuse sets and the second fuse sets is used or indicated as a fail.

2. The memory device of claim 1, wherein the repair unit includes:
   a counting unit generating count signals sequentially corresponding to the first fuse sets and the second fuse sets by counting a clock signal;
   a storage unit storing the information that represents whether each of the first fuse sets and the second fuse sets failed or is usable and outputting information of a corresponding fuse set in response to the count signals; and
   a control unit generating a target signal that represents the selected fuse set pair based on the information outputted from the storage unit in response to the count signals.

3. The memory device of claim 2, wherein the counting unit includes:
   a counter outputting a fuse count signal by increasing a value of the fuse count signal one by one in response to the clock signal; and
   an encoder generating the count signals by encoding the fuse count signal.

4. The memory device of claim 3, wherein the control unit includes:
   a selection signal generator generating a plurality of selection signals that respectively correspond to a plurality of pairs of fuse sets that correspond to each other from the first fuse sets and the second fuse sets;
   a selection signal combiner generating a latch signal by combining the selection signals in response to the count signals; and
   a latch generating the target signal by latching the fuse count signal in response to the latch signal.

5. The memory device of claim 4, wherein the selection signal generator includes a plurality of signal generation elements that respectively correspond to the fuse set pairs, and
   each of the signal generation elements includes:
   a first enable element generating an enable signal of a first fuse set of a corresponding fuse set pair based on the information outputted from the storage unit in response to the count signals;

a second enable element generating an enable signal of a second fuse set of the corresponding fuse set pair based on the information outputted from the storage unit in response to the count signals; and a first signal combining element generating a selection signal of the fuse set pair by combining output signals of the first enable element and the second enable element.

6. The memory device of claim 4, wherein the selection signal combiner includes:

a second signal combining element enabling an output signal according to logic levels of the selection signals in response to the count signals; and a mode selecting element selectively transferring an output signal of the second signal combining element or the information outputted from the storage unit as the latch signal in response to a mode selection signal indicating the mode of the memory device.

7. The memory device of claim 6, wherein the memory cell arrays each include a plurality of memory blocks, and the first fuse sets and the second fuse sets each include a plurality of fuse elements respectively corresponding to the memory blocks.

8. The memory device of claim 7, wherein the counting unit further includes:

a comparator generating a detection signal by comparing a repair target row address with the fuse count signal.

9. The memory device of claim 8, wherein the selection signal combiner further includes:

a latch signal generation element transferring an output signal of the mode selecting element as the latch signal in response to the detection signal.

10. The memory device of claim 8, wherein the first enable element and the second enable element generate an enable signal of a corresponding fuse element among the fuse elements of the first fuse sets and the second fuse sets in response to the detection signal.

11. The memory device of claim 1, wherein a write/read operation accompanied by an Error Correction Code (ECC) operation is performed in order to detect a defect occurring in the memory cell arrays, and alternatively a write/read operation is performed without the ECC operation in order to detect a defect occurring in either the first memory cell arrays or the second memory cell arrays, separately.

12. The memory device of claim 11, wherein the defect occurring in either the first memory cell arrays or the second memory cell arrays is detected by using a data unit of ½*N bits, when the defect occurring in the memory cell arrays is detected by using a data unit of N bits, where N is a natural number.

13. A repair circuit, comprising:

a plurality of first fuse sets corresponding to first memory cell arrays among a plurality of memory cell arrays;

a plurality of second fuse sets corresponding to second memory cell arrays among the memory cell arrays and forming a plurality of fuse set pairs respectively corresponding to the first fuse sets;

a storage unit storing information that represents whether each of the first fuse sets and the second fuse sets failed or is usable; and a control unit selecting one fuse set pair among the fuse set pairs based on the information stored in the storage unit and outputting a target signal, wherein the control unit selects the one fuse set pair or one fuse set from the first fuse sets and the second fuse sets in response to a mode selection signal, wherein in an Error Correction Code (ECC)-on mode, when a defect is detected from the memory cell arrays, a corresponding fuse set pair among the fuse set pairs is used or indicated as a fail.

14. The repair circuit of claim 13, further comprising:

a counting unit generating count signals sequentially corresponding to the first fuse sets and the second fuse sets by counting a clock signal.

15. The repair circuit of claim 14, wherein the storage unit transfers information of a corresponding fuse set among the first fuse sets and the second fuse sets to the control unit in response to the count signals.

16. The repair circuit of claim 14, wherein the control unit includes:

a selection signal generator generating a plurality of selection signals that respectively correspond to the fuse set pairs;

a selection signal combiner generating a latch signal by combining the selection signals in response to the count signals; and a latch generating the target signal by latching the count signals in response to the latch signal.

17. The repair circuit of claim 16, wherein the selection signal generator includes a plurality of signal generation elements that respectively correspond to the fuse set pairs, and each of the signal generation elements includes:

a first enable element generating an enable signal of a first fuse set of a corresponding fuse set pair based on the information stored in the storage unit in response to the count signals;

a second enable element generating an enable signal of a second fuse set of the corresponding fuse set pair based on the information stored in the storage unit in response to the count signals; and a first signal combining element generating a selection signal of the fuse set pair by combining output signals of the first enable element and the second enable element.

18. The repair circuit of claim 16, wherein the selection signal combiner includes:

a second signal combining element enabling an output signal according to logic levels of the selection signals in response to the count signals; and a mode selecting element selectively transferring an output signal of the second signal combining element or the information stored in the storage unit as the latch signal in response to the mode selection signal indicating a mode of a memory device.

19. The repair circuit of claim 13, wherein in an Error Correction Code (ECC)-off mode, when a defect is detected from the first memory cell arrays or the second memory cell arrays, a corresponding fuse set among the first fuse sets and the second fuse sets is used or indicated as a fail.

* * * * *